US012740030B2

(12) United States Patent
Sakaguchi

(10) Patent No.: US 12,740,030 B2
(45) Date of Patent: Sep. 15, 2026

(54) ELECTRICAL COMPONENT

(71) Applicant: HONDA MOTOR CO., LTD., Tokyo (JP)

(72) Inventor: Takanori Sakaguchi, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 52 days.

(21) Appl. No.: 19/063,787

(22) Filed: Feb. 26, 2025

(65) Prior Publication Data

US 2025/0311178 A1 Oct. 2, 2025

(30) Foreign Application Priority Data

Mar. 28, 2024 (JP) ................................ 2024-052866

(51) Int. Cl.
*H05K 7/20* (2006.01)
*H05K 7/14* (2006.01)
*B60L 50/70* (2019.01)

(52) U.S. Cl.
CPC ....... *H05K 7/20927* (2013.01); *H05K 7/1407* (2013.01); *B60L 50/70* (2019.02)

(58) Field of Classification Search
CPC .................................................. H05K 7/20927
See application file for complete search history.

(56) References Cited

U.S. PATENT DOCUMENTS 10,145,498 B2 12/2018 Shimizu
10,968,830 B2 * 4/2021 Snyder .................. F28D 15/025
2013/0048102 A1 * 2/2013 Hagita ................ F04B 39/0027 137/343
2021/0313592 A1 10/2021 Gao et al.
2023/0046075 A1 * 2/2023 Chen .................. H05K 7/20272

FOREIGN PATENT DOCUMENTS

JP 6046812 B2 12/2016
JP 2020-72236 A 5/2020
JP 2021-145395 A 9/2021
JP 2021-536116 A 12/2021

OTHER PUBLICATIONS

Japanese Office Action received in corresponding Japanese application No. 2024-052866 dated Aug. 26, 2025 with English translation (7 pages).

* cited by examiner

*Primary Examiner* — Hung V Ngo
(74) *Attorney, Agent, or Firm* — Rankin, Hill & Clark LLP

(57) ABSTRACT

An electrical component preventing leakage of cooling liquid and allowing anti-vibration includes: an electrical component body housing an electrical element and including a first through-hole for fixing; a plate provided with a second through-hole facing the first through-hole and a cooling hole through which cooling liquid flows; anti-vibration rubbers arranged on one side and other side of the plate while surrounding the second through-hole of the plate and each having a third through-hole facing the second through-hole, and gaskets arranged twice or more times surrounding the cooling hole respectively on the one side and the other side of the plate, wherein the electrical component body, the plate, the anti-vibration rubbers, and the gasket are fixed to a housing, and the electrical component body has a bottom surface at least a portion of which is contact with the cooling liquid flowing through a cooling liquid channel of the housing.

5 Claims, 8 Drawing Sheets

4
5
5b
6h

ELECTRICAL COMPONENT

REFERENCE TO RELATED APPLICATIONS

The present invention relates to and asserts priority from Japanese patent application No. 2024-052866 filed on Mar. 28, 2024, and incorporates the entirety of the contents and subject matter of all the above application herein by reference.

TECHNICAL FIELD

This invention relates to electrical component.

BACKGROUND ART

Conventionally, the following structures may be used to cool heat-generating electrical elements such as capacitors, reactors, and the like.

The heat-generating electrical element is molded with resin to form a molded resin product (hereinafter referred to as "molded product"). A part of the molded product is in contact with cooling liquid, and there is a connection part of components with each other at a point of the contact with the cooling liquid. The connection part is provided with a sealing member to suppress leakage of the cooling liquid. For example, Patent Literature 1 (PTL 1) describes a configuration shown in FIG. 8 below, which shows an enlarged cross-sectional view of a conventional cooling structure for electrical component.

Because an electrical elements 101 such as capacitor and reactor generates heat while operation, an electrical component body 101 of the molded product is cooled by contacting and exchanging heat with cooling liquid 109 flowing through the cooling liquid channel 102*s* formed in the housing 102.

The cylindrical anti-vibration member 103, which is placed between the electrical component body 101 and the housing 102, has a cylindrical anti-vibration rubber 103*r* fixed in a center thereof. The anti-vibration rubber 103*r* dampens vibration of the housing 102.

The electrical component body 101 with a sealing structure is secured to the housing 102 by a bolt 104 that is inserted through the electrical component body 101 and the anti-vibration member 103 to be screwed into the housing 102.

Between the housing 102 and the electrical component body 101 is a seal member 105 having a double seal structure (roughly H-shaped cross-sectional structure) with seals 105*a* and 105*b* that suppress leakage of the cooling liquid 109. The housing 102 has seal member buckling prevention walls 102*a* and 102*b* formed on both sides of the seal member 105 to sandwich the seal member 105 for preventing it from collapse.

CITATION LIST

Patent Literature

PTL 1: Japanese Patent No. 6046812

SUMMARY OF INVENTION

Technical Problem

However, the conventional technology of PTL 1 assumes a structure of a flange connection of piping. Such technology does not consider problems that may arise when cooling the electrical component body 101 by directly contacting it to the cooling liquid 109 in the cooling liquid channel 102*s*, which problem include molding of the cooling liquid channel 102*s* of the housing 102 in which the electrical component body 101 is mounted, anti-vibration effect of the housing 102 against vibration, flow pressure of the cooling liquid applied on the electrical component body 101, and the like.

As shown in FIG. 8, when the sealing member 105 for waterproofing and the anti-vibration member 103 for the anti-vibration are simply lined up, a dimension from the cooling liquid channel 102*s* to a fixing part using a bolt 104 is long.

For example, the waterproofing function requires a length of s1 for the seal member buckling prevention wall 102*a*, a length of s2 for the seal member buckling prevention wall 102*b*, and a groove width of s3 for the seal member 105.

The anti-vibration requires an assembly dimension of s4 for the seal member 105. Because a clearance is required between the seal member buckling prevention wall 102*b* and the anti-vibration member 103, the waterproof and anti-vibration functions require the overall dimension of s1+s2+s3+s5.

In addition, because the seal member 105 that is a component for the waterproofing and the anti-vibration member 103 that is a component for anti-vibration are separate parts, there are problems that many man-hours are required and a large variation in dimensions might occur when assembling them into the housing 102.

The present invention is devised in view of the above-described background, and a purpose of the present invention is to provide an electrical component that can suppress leakage of cooling liquid and also provides anti-vibration.

Solution to Problem

To solve the above problem, an electrical component of the present invention includes: an electrical component body that houses therein an electrical element and has a bottom surface at least a part of which forms a flat shape and a first through-hole for fixing provided on a part of the flat shape; a plate that is provided with a second through-hole facing the first through-hole and a cooling hole through which cooling liquid flows; anti-vibration rubbers arranged on one side and other side of the plate while surrounding the second through-hole of the plate and each having a third through-hole; and gaskets arranged respectively on the one side and the other side of the plate while surrounding the cooling hole twice or more, wherein the electrical component body, the plate, and the anti-vibration rubber, and the gasket are fixed to a housing, and wherein the electrical component body has a bottom surface at least a part of which is contact with the cooling liquid flowing through a cooling liquid channel of the housing.

Effects of Embodiments

The embodiments of the present invention provide an electrical component that is able to suppress leakage of cooling liquid and vibration.

DESCRIPTION OF EMBODIMENTS

First Embodiment

Hereinbelow, detailed description is given of an embodiment of the present invention with reference to the drawings as appropriate.

Figure 1:
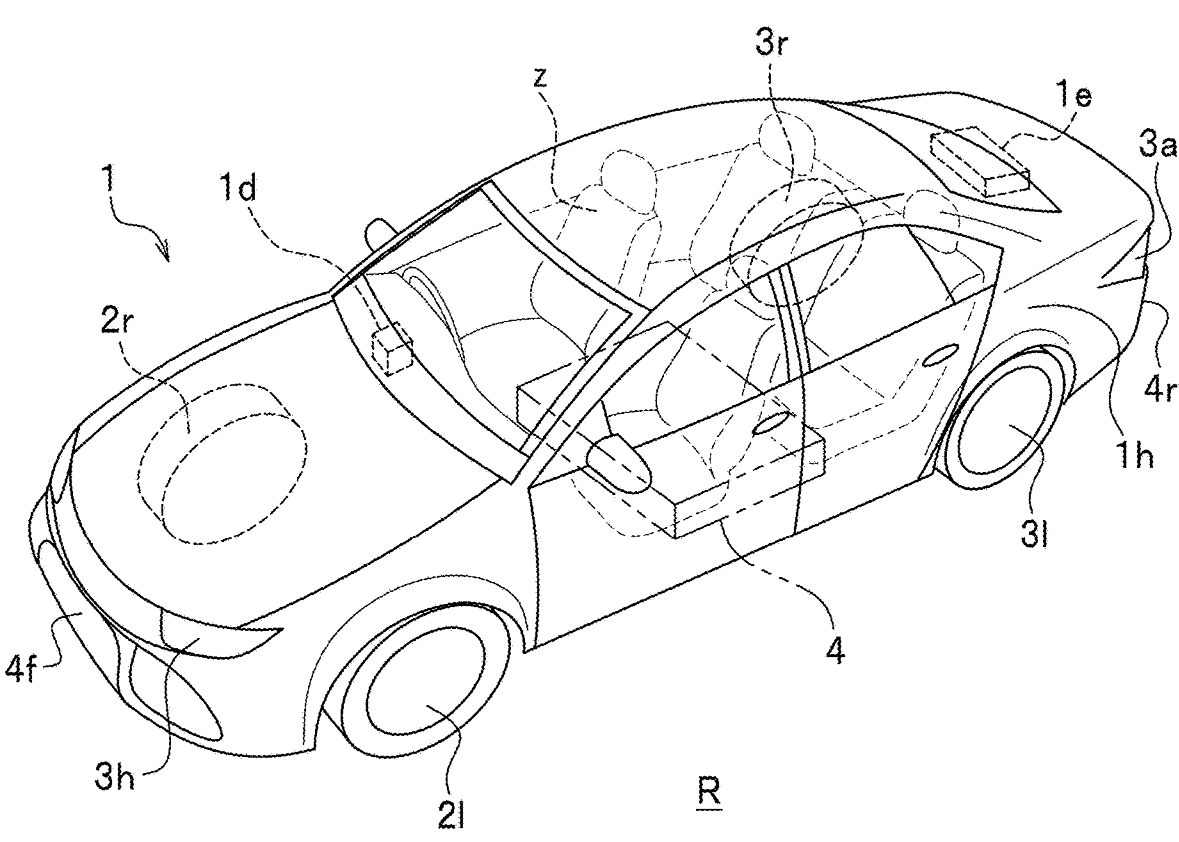
FIG. 1 is a conceptual perspective view of a vehicle of a first embodiment.

FIG. 1 is a conceptual perspective view of a vehicle 1 according to the first embodiment.

The vehicle 1 of the embodiment is, for example, a vehicle powered by a fuel cell or storage battery, i.e., a fuel cell vehicle (FCV), an electric vehicle (BEV), further a hybrid vehicle (HEV). The fuel cell vehicle is a vehicle that runs by turning a motor using electric energy generated by transfer between electrodes of $H+$ (cation) and $O-2$ (anion) produced by chemical reaction between hydrogen and oxygen.

The vehicle 1 is provided at its front side with right front wheels 2*r* and left front wheels 2*l*, which are steering wheels that change a travelling direction of the vehicle 1. The vehicle 1 is provided at its rear side with right rear wheels 3*r* and left rear wheels 3*l*, which are driven wheels or driving wheels.

The vehicle 1 is provided at its front with headlights 3*h* that illuminate front of a road surface R, and at its rear with rear lights 3*a* to illuminate rearward of the road surface R. Further, there are a front bumper 4*f* and a rear bumper 4*r* that absorb impact respectively of front and rear collisions respectively at the front and rear of the vehicle 1.

The vehicle 1 is controlled by a control unit (ECU) 1*e*. Rotation of a vehicle body 1*h* is detected by a yaw rate sensor (not shown), and a steering angle of the vehicle body 1*h* is detected by a steering angle sensor 1*d*.

Shafts and other rotating parts of the right front wheels 2*r* and left front wheels 2*l* are respectively equipped with wheel speed sensors (not shown) to detect rotational speeds of the right front wheels 2*r* and the left front wheels 2*l*.

Information (sensor currents) detected from each of the yaw rate sensor, steering angle sensor 1*d*, and each of the wheel speed sensors is inputted to the control unit 1*e*.

A fuel cell (not shown) is placed on an under panel in the body below a seat z of the vehicle 1.

There is placed just above the fuel cell a VCU (Voltage Control Unit) 4 that works for converting electric power of the fuel cell to a desired voltage.

Figure 2:
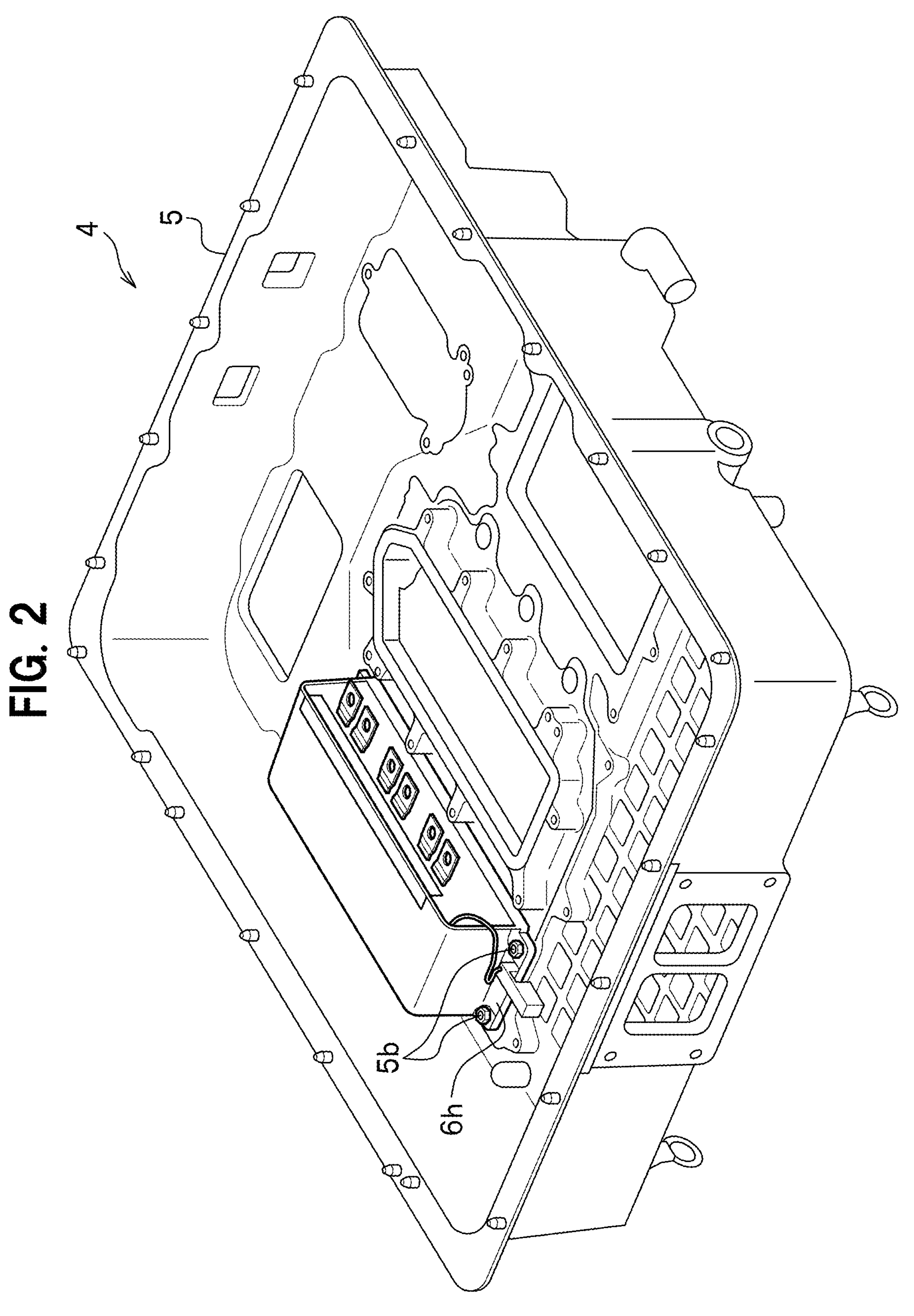
FIG. 2 is a perspective view of a VCU (Voltage Control Unit) case.

The VCU 4 has an outer shell formed by a bottomed box-shaped VCU case (housing) 5 whose top is open as shown in FIG. 2. FIG. 2 is a perspective view of the VCU case 5.

Figure 3:
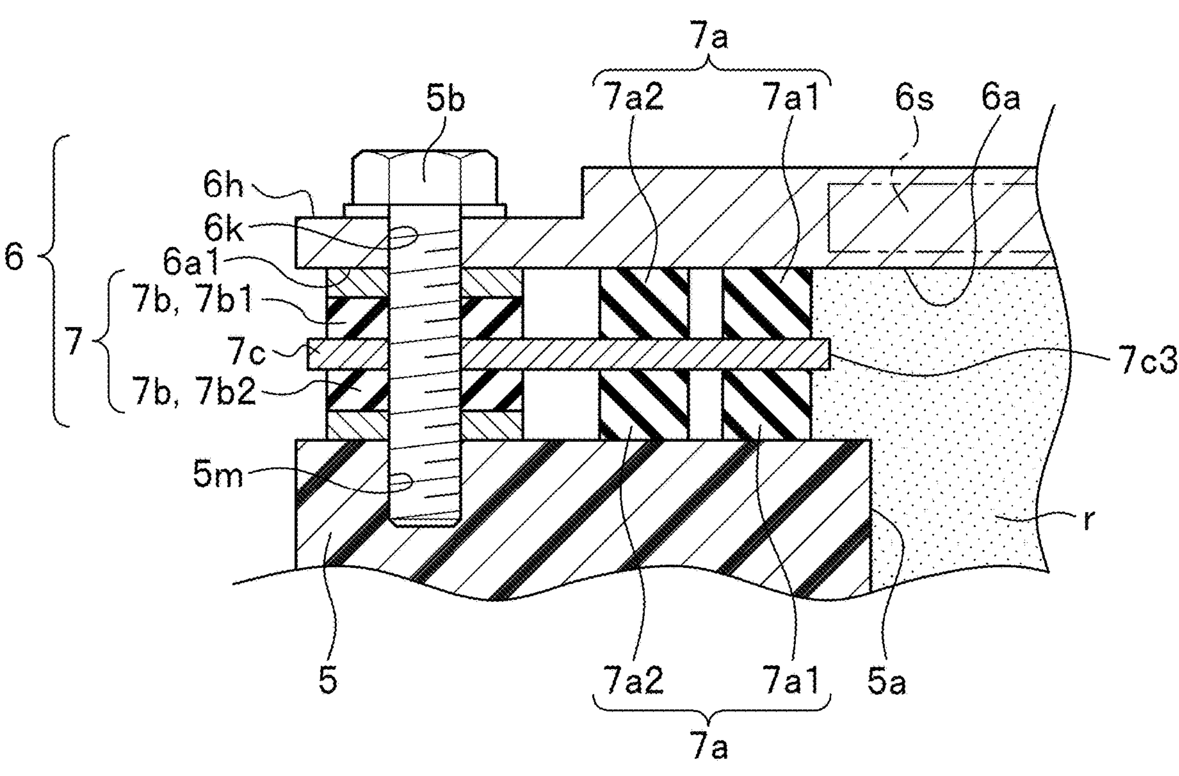
FIG. 3 is a partially enlarged cross-sectional view of a main part of a cooling and anti-vibration structure in the VCU.

FIG. 3 is a partially enlarged cross-sectional view showing a main part of a cooling and anti-vibration structure in the VCU 4.

<VCU Case (Housing) 5>

Inside the VCU case 5, there are mounted electrical elements 6*s* such as capacitors, reactors, power semiconductors, and the like, which generate heat due to ripple current, Joule heat, switching loss, and the like. The electrical elements 6*s* are resin-molded and resin-sealed electrical component body 6*h* in FIG. 3.

To cool the electrical component body 6*h* in which the electric element 6*s* is encapsulated, cooling liquid r (see FIG. 3) flowing through a cooling liquid channel 5*a* is brought into direct contact with the electrical component body 6*h*.

The purpose of the present invention is to improve a function of preventing cooling liquid r from leaking outside, isolation of vibration that is transferred from the VCU case 5 fixed to the vehicle 1 to the electrical component body 6*h*, and assembly workability around the electrical component body 6*h*.

That is, the VCU case 5 is equipped with a structure (cooling liquid channel 5*a* and cooling liquid r) to cool the electrical component body 6*h* in which the heat-generating electric elements 6*s* are encapsulated.

Furthermore, the electrical component 6 (see FIG. 3) has an anti-vibration structure that suppresses vibrations that are transferred from the VCU case 5, which is fixed to the vehicle body 1*h* (see FIG. 1), to the electrical component body 6*h*.

The electrical component 6 shown in FIG. 3 includes an electrical component body 6*h* and a liquid leakage prevention and anti-vibration component 7 that has the function of preventing cooling liquid r from leaking to outside (double sealing gasket 7*a*) and an anti-vibration structure (anti-vibration rubber 7*b*).

<Cooling and Anti-vibration Structure of Electrical Component 6>

Hereinbelow, detailed description is given of the cooling and anti-vibration structure included by the electrical component 6.

The VCU case 5 shown in FIG. 3 includes a cooling liquid channel 5*a*, through which the cooling liquid r flows to cool the heat-generating electrical component body 6*h*. The cooling liquid is heated to be hot through heat exchange with the electrical component body 6*h* and cooled by heat exchange with external air in a radiator (not shown).

As mentioned above, the electrical component body 6*h* is a molded product in which the electric elements 6*s* are encapsulated, and sealed with resin at least a portion (bottom of the electrical component body) 6*a* (see FIG. 3) with which the cooling liquid r comes into contact. The electric elements 6*s* are assumed to include electronic elements.

The electrical component body 6*h* shown in FIG. 3 that houses the electric element 6*s* includes a portion 6*a*1 whose surface forms at least partially a flat shape in the bottom 6*a*. And the first through-hole 6*k* for fixing is formed in the portion 6*a*1 forming the flat shape in the electrical component body 6*h*.

There is fixed the liquid leakage prevention and anti-vibration component 7 between the VCU case 5 and the main body of the electrical component body 6*h*, which are shown in FIG. 3, by a bolt 5*b* being screwed into a female thread 5*m* of the VCU case 5. As mentioned above, the combination of the electrical component body 6*h* and the liquid leakage prevention and anti-vibration component 7 together is called the electrical component 6.

<Liquid Leakage Prevention and Anti-Vibration Component 7>

Figure 4A:
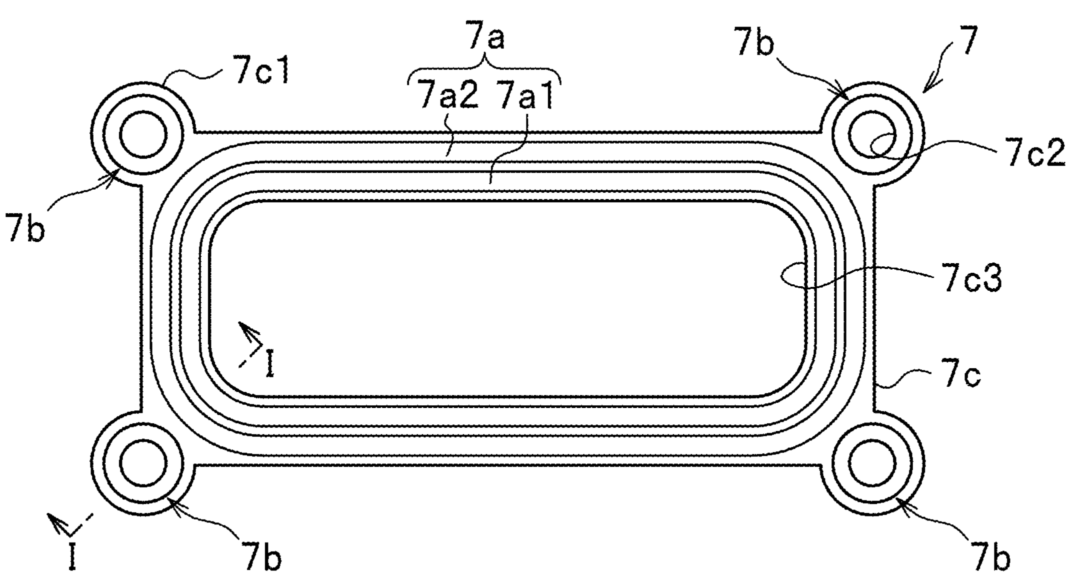
FIG. 4A is a top view of a cooling liquid leakage prevention and anti-vibration component.
Figure 4B:
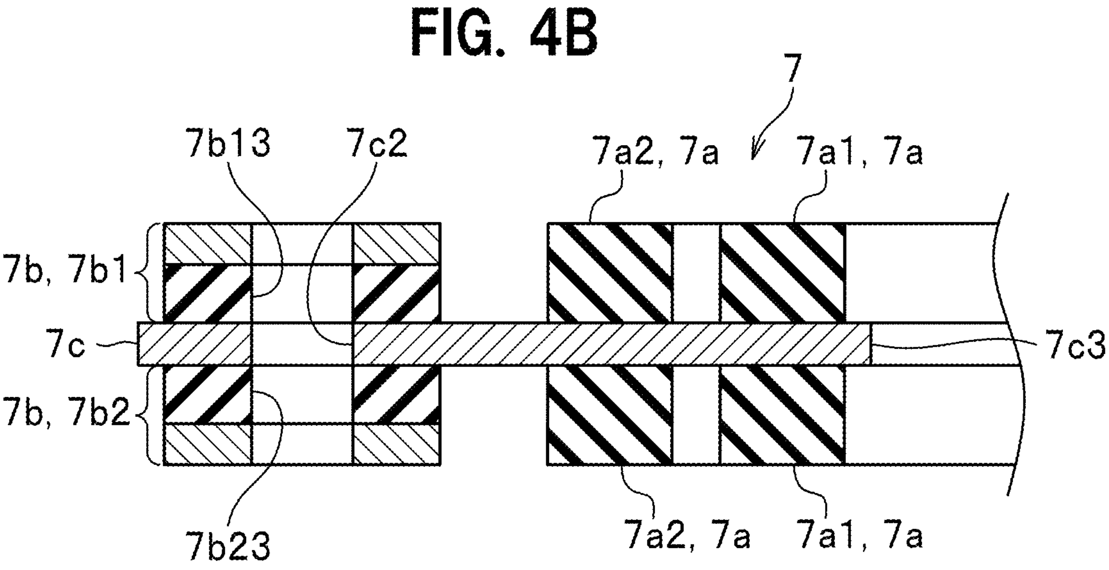
FIG. 4B is a I-I cross sectional view of FIG. 4A.

FIG. 4A is a top view of the liquid leakage prevention and anti-vibration component 7. FIG. 4B is a cross section at I-I of FIG. 4A.

Figure 5A:
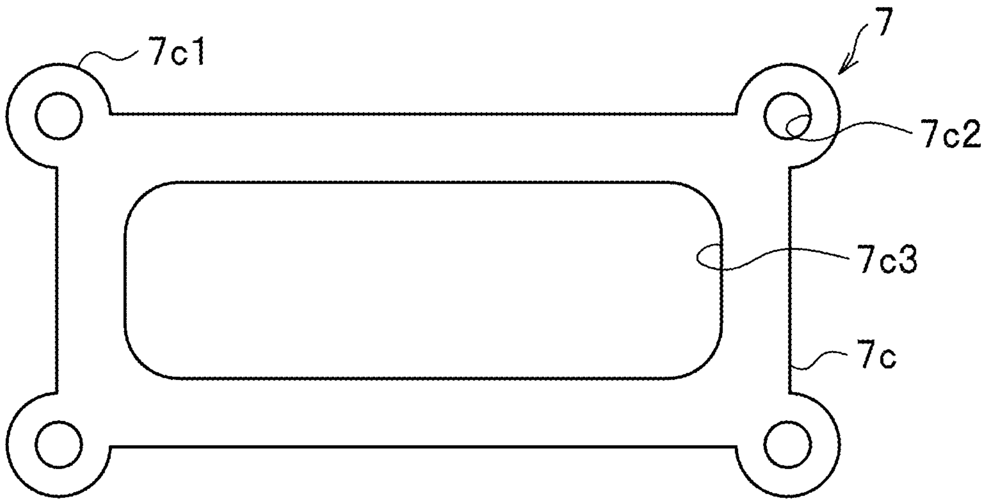
FIG. 5A is top view of a support plate.
Figure 5B:
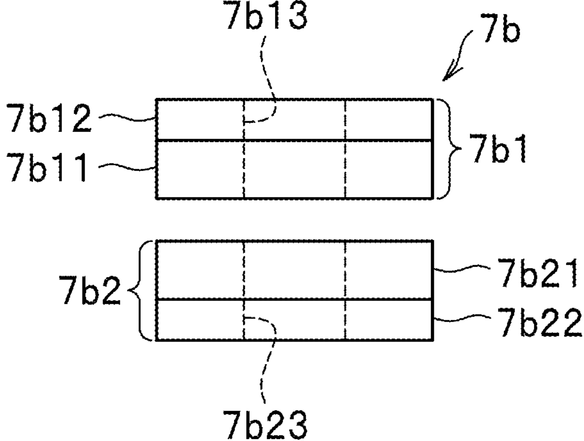
FIG. 5B is a exploded side view of an anti-vibration rubber.

FIG. 5A is a top view of a support plate 7*c* and FIG. 5B is an exploded side view of the anti-vibration rubber 7*b*.

As mentioned above, the liquid leakage prevention and anti-vibration component 7 shown in FIG. 4A is a single component (see FIG. 4B) including a double sealing gasket 7*a* and four anti-vibration rubbers 7*b* that are vulcanization-bonded to both sides of the support plate 7*c* that is a single-layer structural material (see FIG. 5A).

The double sealing gasket 7*a* is a doubly arranged, annular, leak-proof rubber for preventing the cooling liquid r from leaking outside.

The anti-vibration rubber 7*b* suppresses the vibrations from the vehicle 1 (FIG. 1) from transmitting to the electrical component body 6*h*.

<Support Plate 7*c*>

The support plate 7*c* shown in FIG. 5A consists mainly, for example, of a long rectangular thin metal plate.

The support plate 7*c* has a circular protrusion 7*c*1 at each of its four corners. A center of the circular protrusion 7*c*1 is penetrated with a round hole 7*c*2.

There is formed in the center of the support plate 7*c* a large, rectangular elongate hole 7*c*3 through which the cooling liquid r flows (See FIG. 3). The shape of the elongate hole 7*c*3 is not limited to rectangular.

The support plate 7*c* is made by sheet-metal forming using a stainless steel plate or the like with a titanium layer formed on its surface. The support plate 7*c* may be made of a rust-proofed ordinary steel plate (SS400), general rolling structural steel sheet (SPHC, and the like), or any other metal sheet other than stainless steel plate.

Or, the support plate 7*c* can be made of any material other than a metal plate, such as a reinforced plastic plate with glass fiber or carbon fiber, as long as the material satisfies prescribed conditions on strength, rust resistance, weather resistance, aging degradation resistance, and the like.

<Double Sealing Gasket 7*a*>

The double sealing Gasket 7*a* shown in FIGS. 4A and 4B is placed respectively on both sides of the support plate 7*c*. In detail, the double sealing gasket 7*a* is placed on one side and on the other side of the support plate 7*c*.

The double sealing gasket 7*a* includes a first sealing gasket 7*a*1 and a second sealing gasket 7*a*2.

The double sealing gasket 7*a* is vulcanization-bonded to the one side and the other side of the support plate 7*c* respectively.

As shown in FIG. 4B, the first sealing gasket 7*a*1 has a rectangular cross section and is annularly formed around the elongate hole 7*c*3 of the support plate 7*c* (see FIG. 4A).

The second sealing gasket 7*a*2 has a rectangular cross section and is annularly formed around and outside the first sealing gasket 7*a*1.

As described above, the double sealing gasket 7*a* is doubly formed on the outside of the elongate hole 7*c*3 of the support plate 7*c*.

The bolts 5*b* shown in FIG. 3 are screwed into the female threads 5*m* of the VCU case 5, and thereby the double sealing gasket 7*a* placed on the one side and the other side of the support plate 7*c* is pressed and fixed to the VCU case 5 and the electrical component body 6*h*. Pressing the double sealing gasket 7*a* causes it to elastically deform on the one side and the other side of the support plate 7*c* and to adhere to the VCU case 5 and the electrical component body 6*h*. The adhesion of the double sealing gasket 7*a* securely prevents leakage of the cooling liquid r (see FIG. 3).

<Anti-Vibration Rubber 7*b*>

The anti-vibration rubber 7*b* shown in FIGS. 4A and 4B dampens and isolates the vibration of the VCU case 5 so that the vibration does not propagate to the electrical component 6.

The anti-vibration rubber 7*b* includes a first anti-vibration rubber 7*b*1 and a second anti-vibration rubber 7*b*2.

The first anti-vibration rubber 7*b*1 is placed on one side of the support plate 7*c*, and the second anti-vibration rubber 7*b*2 is placed on the other side of the support plate 7*c*.

The first and second anti-vibration rubbers 7*b*1 and 7*b*2 have a first center hole 7*b*13 and a second center hole 7*b*23 respectively penetrating through their centers, which are approximately the same size as the round hole 7*c*2 in the circular protrusion 7*c*1.

The first anti-vibration rubber 7*b*1 has a rubber portion 7*b*11 and a washer portion 7*b*12.

The rubber portion 7*b*11 is formed of, for example, rubber, which has a vibration damping effect. In detail, the rubber portion 7*b*11 has a spring constant and internal resistance, and dampens vibration through energy loss and internal friction. The rubber portion 7*b*11 is made using, for example, natural rubber, butyl rubber, silicone rubber, and the like. Other materials may be used for the rubber portion 7*b*11 as long as they have a vibration-damping effect and satisfy certain conditions such as abrasion resistance, weather resistance, and aging degradation resistance.

The washer portion 7*b*12 is mainly made of rust proofed ordinary steel sheet (SS400), structural steel sheet for general rolling (SPHC, etc.), stainless steel plate (SUS), and the like. The washer portion 7*b*12 may be made of other materials as long as they meet requirements of strength, abrasion resistance, rust resistance, and the like.

The second anti-vibration rubber 762 has a rubber portion 7*b*21 and a washer portion 7*b*22.

The rubber portion 7*b*21 is made of the same material as the rubber portion 7*b*11 described above.

The washer portion 7*b*22 is made of the same material as the washer portion 7612 described above.

As mentioned above, the double sealing gasket 7*a* and anti-vibration rubber 7*b* (7*b*1, 7*b*2) shown in FIGS. 4A and 4B are structured to be vulcanization-bonded respectively to the one side and the other side of the support plate 7*c* to be integrated into one body.

Effect of First Embodiment

The above structure shows that the liquid leakage prevention and anti-vibration component 7 is effective in anti-vibration and further in cooling the electrical component 6 by directly contacting the cooling liquid r in the cooling liquid channel 5*a* (FIG. 3) to the electrical component 6. The liquid leakage prevention and anti-vibration component 7 is easy to manufacture because it is made into a single component by vulcanization-bonding the double sealing gasket 7*a* and the anti-vibration rubber 7*b* sandwiching the support plate 7*c* on its both sides.

Also, assembly is easy because it is completed through handling only one component of the liquid leakage prevention and anti-vibration component 7. This reduces the number of parts and makes production easier. Further, workability in assembling the electrical component 6 is able to be improved. Therefore, a highly productive structure is achieved.

In addition to the anti-vibration effect of the double sealing gasket 7*a*, the single component of the liquid leakage prevention and anti-vibration component 7 made by sandwiching can suppress deformation of the double sealing gasket 7*a* due to water pressure, even when cooling the electrical component body 6*h* through direct contact to the cooling liquid r in the cooling liquid flow channel 5*a*. In addition, the double surrounding structure of the double sealing gasket 7*a* shown in FIGS. 4A and 4B allows reliably suppressing leakage of the cooling liquid r with the second sealing gasket 7*a*2, even if the single first sealing gasket 7*al* leaks. Therefore, it is possible to improve the quality of the electrical component body 6*h* shown in FIG. 3, which requires vibration isolation and cooling.

In the first embodiment, the double sealing gasket 7*a* that is structured with two enclosures is exemplified, but a multi-enclosure sealing gasket structured with three or more enclosures may be also used.

Second Embodiment

A liquid leakage prevention and anti-vibration component 27 of the second embodiment differs from the liquid leakage prevention and anti-vibration component 7 of the first embodiment, which is integrally fixed, in that the liquid leakage prevention and anti-vibration 27 has a structure to be assembled.

Other components of the liquid leakage prevention and anti-vibration component 27 have the same design as those of the liquid leakage prevention and anti-vibration component 7, and thus identical components are indicated with the numbers in the twenties whose first digit is the same as those of the liquid leakage prevention and anti-vibration component 7, and overlapped explanations are omitted.

Figure 6A:
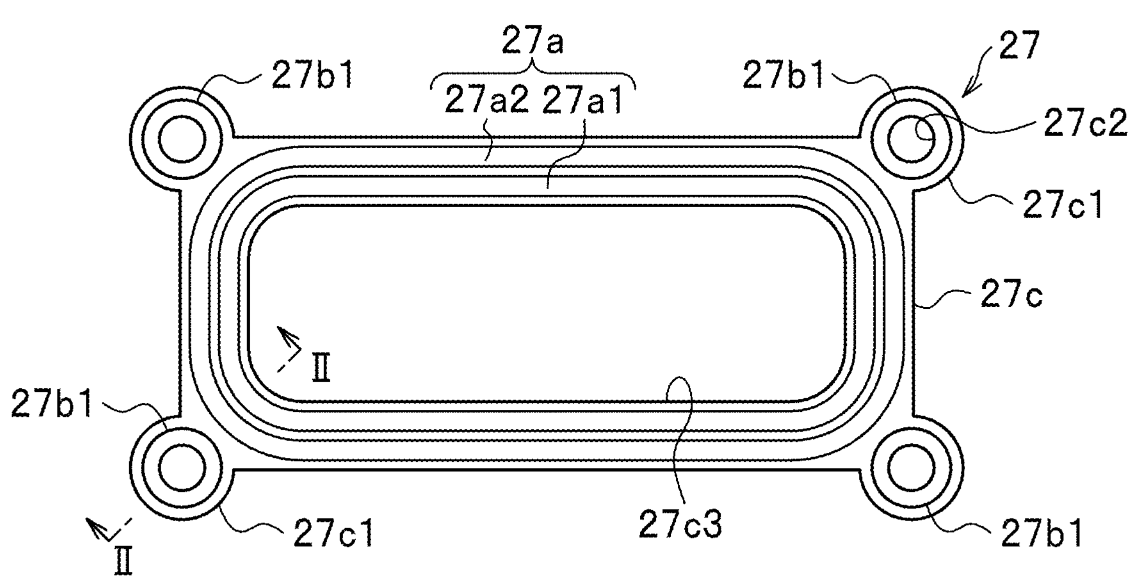
FIG. 6A is a view of a cooling liquid leakage prevention and anti-vibration component viewed from one side according to a second embodiment.
Figure 6B:
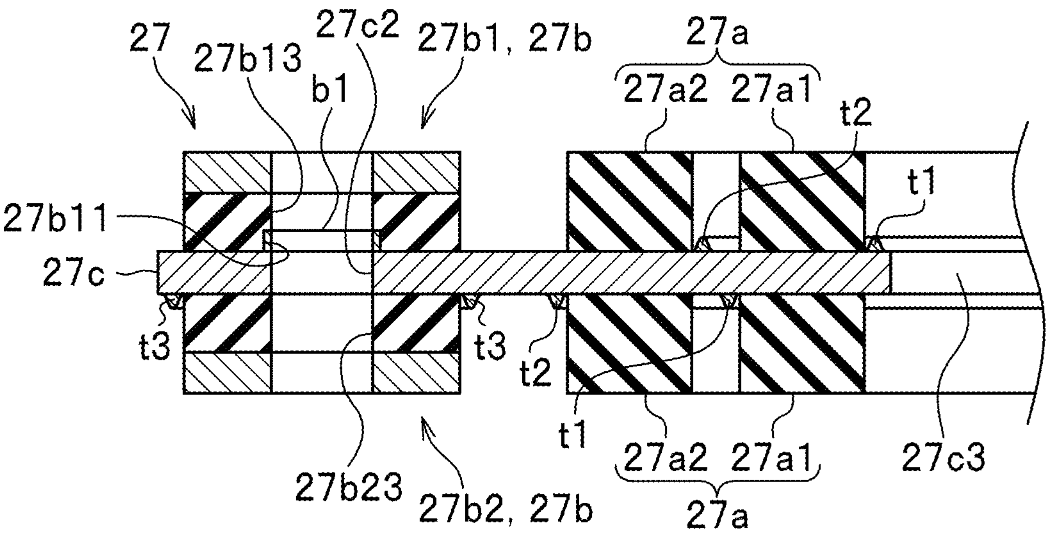
FIG. 6B is a partially enlarged view of a II-II cross-section of FIG. 6A.

FIG. 6A is a view seen from one side of the liquid leakage prevention and anti-vibration component 27 of the second embodiment. FIG. 6B is a partially enlarged view of the II-II cross-section of FIG. 6A.

Figure 7:
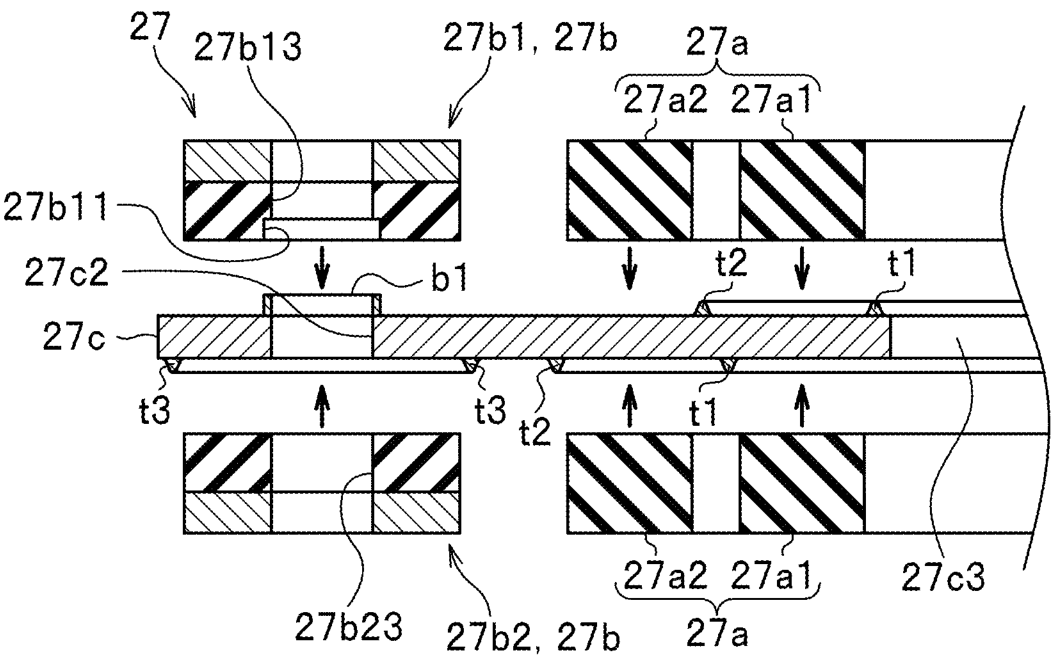
FIG. 7 is a partially enlarged view of the II-II cross-section of FIG. 6A showing a process of assembling the cooling liquid leakage prevention and anti-vibration components.
Figure 8:
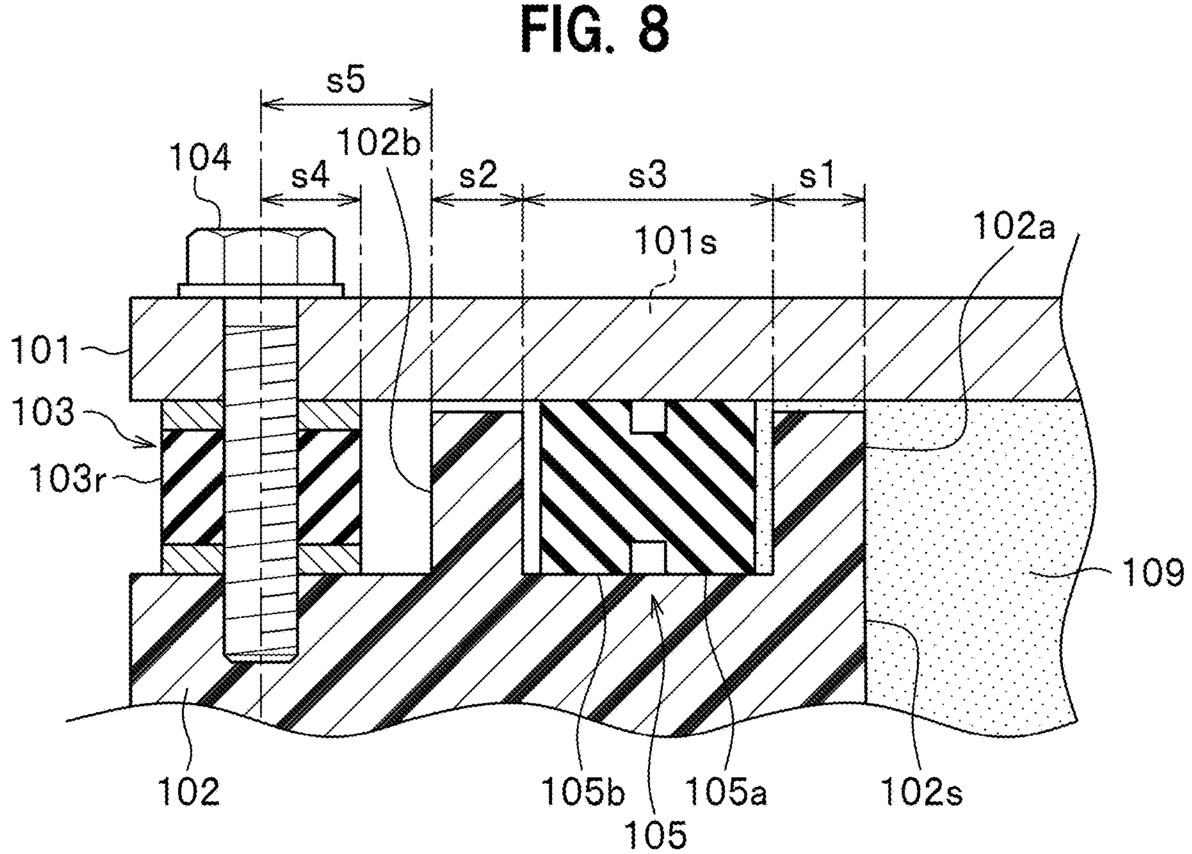
FIG. 8 is a partially enlarged cross-sectional view of a conventional cooling structure for an electrical component.

FIG. 7 is a partially enlarged view of the II-II cross-section of FIG. 6A showing a process of assembling the liquid leakage prevention and anti-vibration component 27.

On one side and the other side of the support plate 27*c* of the second embodiment shown in FIGS. 6A and 6B, there are arranged two of double sealing gaskets 27*a*, in an annularly continuous manner of doubly surrounding a central elongate hole 27*c*3.

In detail, the support plate 27*c* has an annular first sealing gasket 27*a*1 on the one side around the central elongate hole 27*c*3. Here, on the one side of the support plate 27*c*, a plurality of protrusions t1 (see FIG. 6B) for a first positioning of the first sealing gasket 27*a*1 are formed by drawing. The protrusions t1 for the first positioning are used to facilitate positioning of the first sealing gasket 27*a*1 on the support plate 27*c*.

The second sealing gasket 27*a*2, which is formed in a continuous annular form, is located outside the first sealing gasket 27*a*1 on the support plate 27*c*. Here, on the one side of the support plate 27*c*, there are multiple protrusions t2 for a second positioning of the second sealing gaskets 27*a*2 (see FIG. 6B) formed by drawing. The protrusions t2 allows the second gasket 27*a*2 to be easily positioned on the support plate 27*c*.

Similarly, an annular first sealing gasket 27*a*1 and an annular second sealing gasket 27*a*2 are arranged in a manner of surrounding the elongate hole 27*c*3 on the other side of the support plate 27*c*.

The first sealing gasket 27*a*1 is positioned on the support plate 27*c* by the first positioning protrusion t1 formed on the other side of the support plate 27*c*. The second sealing gasket 27*a*2 is positioned on the support plate 27*c* by the projection t2 formed on the other side of the support plate 27*c* for the second positioning.

The support plate 27*c* shown in FIG. 6A has a circular protrusion 27*c*1 in each of the four corners, and a round hole 27*c*2 penetrating through the center of the circular protrusion 27*c*1.

A first anti-vibration rubber 27*b*1 is provided on one side of the circular protrusion 27*c*1.

A second anti-vibration rubber 27*b*2 is provided on the other side of the 27*c*1.

The first anti-vibration rubber 27*b*1 has a first center hole 27*b*13 in the center.

The second anti-vibration rubber 27*b*2 has a second center hole 27*b*23 in the center.

As shown in FIG. 6B, on one side of the support plate 27*c*, the first anti-vibration rubber 27*b*1 is placed so that the first center hole 27*b*13 is substantially aligned with the round hole 27*c*2 in the support plate 27*c*. Here, on the one side of the four circular protruding portions 27*cl*, a first anti-vibration rubber positioning protrusion b1 is formed by burring or drawing. Note that the first anti-vibration rubber 27*b*1 has an escape portion 27*b*11 (see FIGS. 6B and 7) recessed for the first anti-vibration rubber positioning protrusion b1 (see FIGS. 6B and 7). As a result, the first anti-vibration rubber positioning protrusion b1 is formed outside of the bolt 5*b* (see FIG. 3) so that the first anti-vibration rubber positioning protrusion b1 does not get in a way of the bolt 5*b*. As shown in FIGS. 6B and 7, the first anti-vibration rubber positioning protrusion b1 allows easy installation of the four first anti-vibration rubbers 27*b*1 on the one side of the support plate 27*c*.

Similarly, on the other side of the support plate 27*c*, the second anti-vibration rubber 27*b*2 is disposed so that the second center hole 27*b*23 is substantially aligned with the round hole 27*c*2 of the support plate 27*c*. Here, on the other side of the four circular protruding portions 27*cl*, a second anti-vibration rubber positioning protrusion t3 for the second anti-vibration rubber 27*b*2 is formed by burring or drawing. As shown in FIGS. 6B and 7, the second anti-vibration rubber positioning protrusions t3 facilitate installation of the four second anti-vibrations 27*b*2 on the other side of the support plate 27*c*. FIGS. 6B and 7 show a case in which the first anti-vibration rubber 27*b*1 is positioned by the first anti-vibration rubber positioning protrusion b1 made by the burring, and a case in which the second anti-vibration rubber 27*b*2 is positioned by the second anti-vibration rubber positioning protrusion t3 made by the drawing.

The first anti-vibration 27*b*1 and the second anti-vibration 27*b*2 both may be positioned by the positioning protrusions made by the drawing, or by positioning protrusions made by the burring, and the form of components for positioning may be selected arbitrarily.

<Applications of Industrial Adhesive and Industrial Double-Coated Adhesive Tape>

The double sealing gasket 27*a* may be fixed on the one side and the other of the support plate 27*c* by applying industrial adhesive or industrial double-sided tape on an attachment surface of the double sealing gasket 27*a* onto the support plate 27*c* and/or an attachment surface of the support plate 27*c* onto the double sealing gasket 27*a*.

Similarly, the first anti-vibration rubber 27*b*1 and the second anti-vibration rubber 27*b*2 may be fixed on the one side and the other side of the support plate 27*c* by applying industrial adhesive (simply adhesive) or industrial double-sided tape (simply double-sided tape) on the attachment surfaces of the first and second anti-vibration rubbers 27*b*1 and 27*b*2 onto the support plate 27*c* and/or the attachment surfaces of the support plate 27*c* onto the first and second anti-vibration rubbers 27*b*1 and 27*b*2. If the industrial adhesive (simply adhesive) or industrial double-sided tape (simply double-sided tape) is applied, the double sealing gasket 27*a* and the first and second anti-vibration rubbers 27*b*1 and 27*b*2 are securely fixed onto the support plate 27*c*. This facilitates assembly and improves workability.

Effect of Second Embodiment

As described above, similarly to the first embodiment, the liquid leakage prevention and anti-vibration component 27 causes the anti-vibration effect and further the effect of suppressing leakage of the cooling liquid r even when cooling the electrical component 6*h* by making it directly contact with the cooling liquid r in the cooling liquid channel (see FIG. 3). In addition, the liquid leakage prevention and anti-vibration component 27 allows assembly to be completed by only assembling the liquid leakage prevention and anti-vibration component 27, which makes assembly easy and improves workability.

In further addition to the anti-vibration effect by the double sealing gasket 27*a*, even when cooling the electrical component body 6*h* by making it directly contact with the cooling liquid r in the cooling liquid channel 5*a* (see FIG. 3), the liquid leakage prevention and anti-vibration component 27 prevents the double sealing gasket 27*a* from being deformed by water pressure by sandwiching the support plate 27*c*. In further addition, the double sealing gasket 127*a* shown in FIGS. 6A and 6B is structured in the double-structure, which can reliably suppress leakage of the cooling liquid.

Other Embodiments

1) The above embodiments describe the cases in which the electrical component 6 is applied to the vehicle 1, but it can be effectively applied to any machinery other than the vehicle 1, such as ships, heavy machinery, machine tools, general machinery, airplanes, flying vehicles, and the like.
2) This invention is not limited to the configurations of the first and second embodiments described above, but various modifications and detailed variations from the above two embodiments are available within the scope of the appended claims.

REFERENCE SIGNS LIST

5: VCU case (housing)
5*a*: Cooling liquid channel
6: Electrical component
6*a*: Bottom of electrical component body
6*a*1: Surface that forms a flat shape
6*h*: Electrical component body
6*k*: First through-hole
6*s*: Electric element
7*a*: Double sealing gasket (gasket)
7*b*1: First anti-vibration rubber (anti-vibration rubber)
7*b*13: First center hole (third through-hole)
7*b*2: Second anti-vibration rubber (anti-vibration rubber)
7*b*23: Second center hole (third through-hole)
7*c*: Support plate (plate)
7*c*2: Round hole (Second through-hole)
7*c*3: Elongate hole (cooling hole)
r: Cooling liquid

The invention claimed is:

1. An electrical component comprising:
an electrical component body that houses therein an electrical element and is provided with a first through-hole for fixing;
a plate that is provided with a second through-hole arranged facing the first through-hole and a cooling hole through which cooling liquid flows;
anti-vibration rubbers arranged on one side and other side of the plate while surrounding the second through-hole of the plate and each having a third through-hole facing the second through-hole, and
gaskets arranged twice or more times surrounding the cooling hole respectively on the one side and the other side of the plate,
wherein
the electrical component body, the plate, the anti-vibration rubbers, and the gaskets are fixed to a housing, and
the electrical component body has a bottom surface at least a part of which is contact with the cooling liquid flowing through a cooling liquid channel of the housing.

2. The electrical component according to claim 1, wherein
the first through-hole is provided at a place that forms a flat surface on the bottom surface of the electrical component body.

3. The electrical component according to claim 1, wherein
the anti-vibration rubber and the gaskets are fixed to the plate and structured as a single unit.

4. The electrical component according to claim 3, wherein
the anti-vibration rubber and the gasket are vulcanization-bonded to the plate.

5. The electrical component according to claim 3, wherein
the anti-vibration rubber and the gasket are attached to the plate through adhesive or double-sided tape.

* * * * *